(12) United States Patent
Tanaka

(10) Patent No.: US 8,410,473 B2
(45) Date of Patent: Apr. 2, 2013

(54) LIGHT EMITTING DEVICE

(75) Inventor: Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/291,176

(22) Filed: Nov. 8, 2011

(65) Prior Publication Data

US 2012/0049159 A1 Mar. 1, 2012

Related U.S. Application Data

(63) Continuation of application No. 12/472,447, filed on May 27, 2009, now Pat. No. 8,080,818.

(30) Foreign Application Priority Data

Aug. 6, 2008 (JP) .................................. 2008-203039

(51) Int. Cl.
  *H01L 29/06* (2006.01)
(52) U.S. Cl. ..... 257/15; 257/14; 257/101; 257/E21.116; 372/45.01
(58) Field of Classification Search ........................ None
  See application file for complete search history.

(56) References Cited

U.S. PATENT DOCUMENTS

| 5,392,306 A | 2/1995 | Usami et al. |
| 5,740,192 A | 4/1998 | Hatano et al. |

FOREIGN PATENT DOCUMENTS

| JP | 06-021583 | 1/1994 |
| JP | 11-008406 | 1/1999 |
| JP | 2000-332364 | 11/2000 |
| JP | 2003-289156 | 10/2003 |
| JP | 2006-013462 | 1/2006 |
| JP | 2006-324685 | 11/2006 |

OTHER PUBLICATIONS

Japanese Office Action for Japanese Application No. 2008-203039 issued on Aug. 1, 2011.
United States Office Action for U.S. Appl. No. 12/472,447 issued on Apr. 28, 2011.
http://hyperphysics.phy-astr.gsu.edu/hbase/debrog.html#c5.
Shigekawa et al., "High-field electron velocity measurement in GaAs/AlGaAs multiple-quantum wells", Appl. Phys. Lett. 61 (13), Sep. 26, 1992, p. 1555-1557.
Japanese Office Action for Japanese Application No. 2008-203039 issued on Jan. 7, 2011.

*Primary Examiner* — Tan N Tran
*Assistant Examiner* — Scott R Wilson
(74) *Attorney, Agent, or Firm* — Turocy & Watson, LLP

(57) ABSTRACT

A light emitting device includes: a first layer made of a semiconductor of a first conductivity type; a second layer made of a semiconductor of a second conductivity type; an active layer including a multiple quantum well provided between the first layer and the second layer, impurity concentration of the first conductivity type in each barrier layer of the multiple quantum well having a generally flat distribution or increasing toward the second layer, average of the impurity concentration in the barrier layer on the second layer side as viewed from each well layer of the multiple quantum well being equal to or greater than average of the impurity concentration in the barrier layer on the first layer side, and average of the impurity concentration in the barrier layer nearest to the second layer being higher than average of the impurity concentration in the barrier layer nearest to the first layer.

11 Claims, 5 Drawing Sheets

LIGHT EMITTING DEVICE

CROSS-REFERENCE TO RELATED APPLICATIONS

This application is a Continuation of application Ser. No. 12/472,447 filed May 27, 2009; the entire contents of which are incorporated herein by reference.

This application is based upon and claims the benefit of priority from the prior Japanese Patent Application No. 2008-203039, filed on Aug. 6, 2008; the entire contents of which are incorporated herein by reference.

BACKGROUND OF THE INVENTION

1. Field of the Invention

This invention relates to a light emitting device.

2. Background Art

A white LED with high emission efficiency realizes an illumination device that can replace incandescent lamps and fluorescent lamps and facilitates low power consumption. Furthermore, a blue-violet semiconductor laser device with high emission efficiency facilitates enhancing the performance of DVD (digital versatile disc) and other optical disc drives.

These light emitting devices are made of nitride semiconductors. In the case where the active layer thereof has a multiple quantum well structure, the piezoelectric effect due to lattice mismatch tilts the energy band of the barrier layer and the well layer. In the tilted energy band, electrons are likely to be spatially distant from holes in the well layer.

When carriers are injected into the multiple quantum well, it is likely that there are more electrons than holes in the well layer located at one end of the multiple quantum well, and more holes than electrons in the well layer located at the other end thereof.

Thus, the multiple quantum well made of nitride semiconductors has a problem of decreased emission efficiency due to low carrier recombination probability.

JP-A-2006-013463(Kokai) discloses a technique related to a nitride semiconductor light emitting element which includes a light emitting layer having a multiple quantum well structure with relaxed compressive strain. In this technique, each of the barrier layers, which sandwich the light emitting layer on both sides, contains impurity throughout the layer, and the impurity concentration in the center portion along the thickness direction is higher than in the portion in contact with the well layer. It is stated that this enables high emission intensity.

However, even in this technique, the energy band bending throughout the multiple quantum well layers constituting the active layer is small, and insufficient for transferring carriers so that they are efficiently confined in the multiple quantum well layers. In particular, holes, which have a large mass, are more difficult to migrate than electrons. Hence, it is not easy to enhance emission efficiency.

SUMMARY OF THE INVENTION

According to an aspect of the invention, there is provided a light emitting device including: a first layer made of a semiconductor of a first conductivity type; a second layer made of a semiconductor of a second conductivity type; an active layer including a multiple quantum well provided between the first layer and the second layer, impurity concentration of the first conductivity type in each barrier layer of the multiple quantum well having a generally flat distribution or increasing toward the second layer, average of the impurity concentration in the barrier layer on the second layer side as viewed from each well layer of the multiple quantum well being equal to or greater than average of the impurity concentration in the barrier layer on the first layer side, and average of the impurity concentration in the barrier layer nearest to the second layer being higher than average of the impurity concentration in the barrier layer nearest to the first layer.

According to another aspect of the invention, there is provided a light emitting device including: a first layer made of a semiconductor of a first conductivity type; a second layer made of a semiconductor of a second conductivity type; an active layer including a multiple quantum well provided between the first layer and the second layer, impurity concentration of the first conductivity type in each barrier layer of the multiple quantum well having a generally flat distribution, the impurity concentration in the barrier layer on the second layer side as viewed from each well layer of the multiple quantum well being greater than the impurity concentration in the barrier layer on the first layer side.

According to another aspect of the invention, there is provided a light emitting device including: a first layer made of a semiconductor of a first conductivity type; a second layer made of a semiconductor of a second conductivity type; an active layer including a multiple quantum well provided between the first layer and the second layer, impurity concentration of the first conductivity type in each barrier layer of the multiple quantum well increasing toward the second layer, the impurity concentration in the barrier layer on the second layer side as viewed from each well layer of the multiple quantum well being greater than the impurity concentration in the barrier layer on the first layer side.

DETAILED DESCRIPTION OF THE INVENTION

An embodiment of the invention will now be described with reference to the drawings.

Figure 1A:
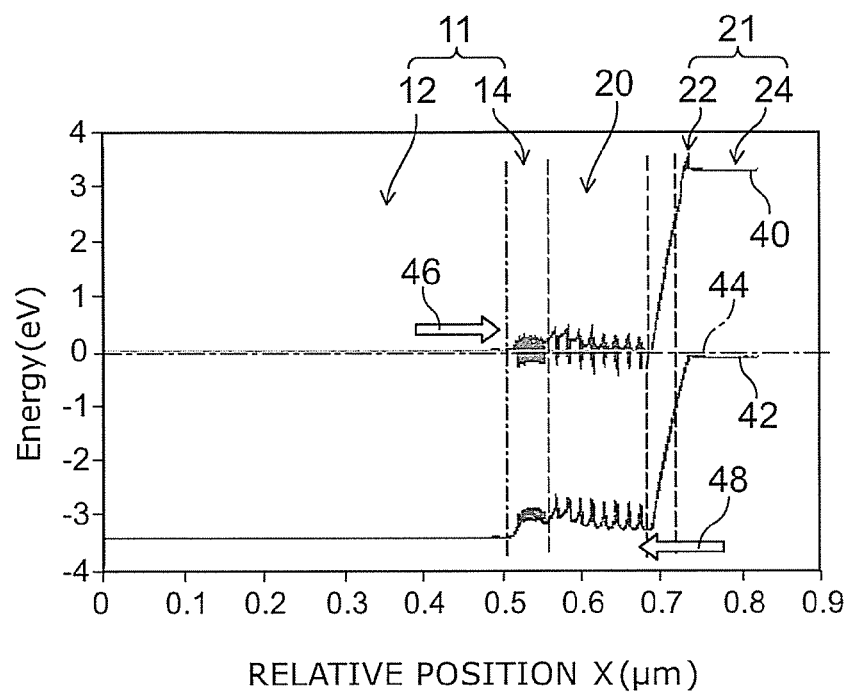
FIGS. 1A and 1B show a nitride semiconductor light emitting device according to this embodiment.
Figure 1B:
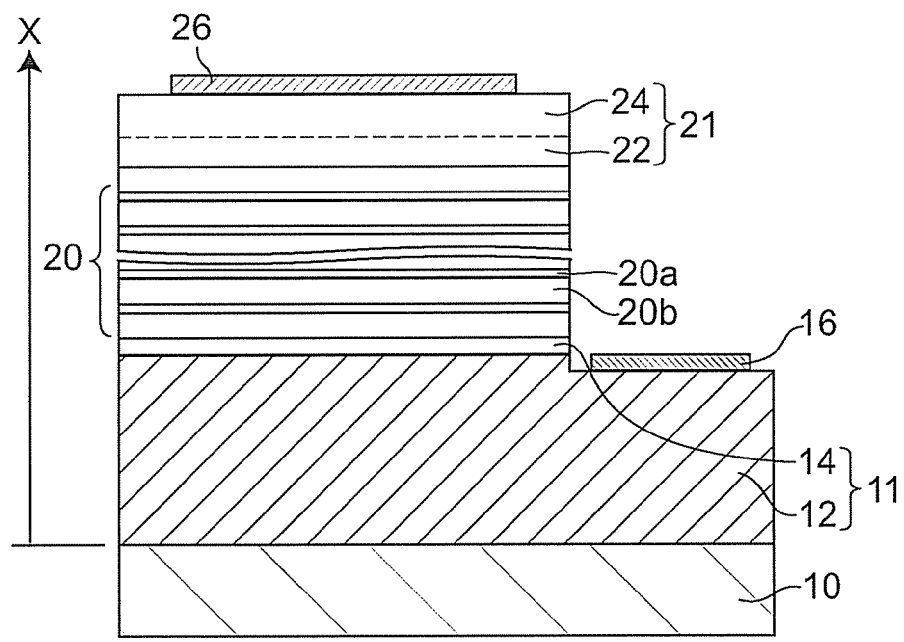

FIG. 1 shows a nitride semiconductor light emitting device according to the embodiment of the invention. More specifically, FIG. 1A is an energy band diagram in the equilibrium state thereof, and FIG. 1B is a schematic cross-sectional view.

The embodiment shown in this figure illustrates a light emitting device used for a white LED light source and being capable of emitting light in the ultraviolet to green wavelength range.

An active layer 20 of the light emitting device includes a well layer 20a made of $In_xGa_{1-x}N$ (where $0.05 \leq x \leq 1$) and a barrier layer 20b made of $In_yGa_{1-y}N$ (where $0 \leq y \leq 1$ and $x > y$). A first layer 11 of n-type is made of $Al_tGa_{1-t}N$ (where $0 \leq t \leq 1.0$), and a second layer 21 of p-type is made of $Al_uGa_{1-u}N$ (where $0 \leq u \leq 1.0$). More preferably, the aluminum composition ratios t and u are equal to or greater than 0 and equal to or less than 0.2.

A more detailed structure is shown in FIG. 1B. The first layer (n-type layer) 11, the active layer 20, the second layer (p-type layer) 21, and a p-side electrode 26 are provided on a sapphire substrate 10. The first layer 11 includes a foundation layer 12 made of an n-type GaN layer, and a superlattice layer made of n-type $In_{0.1}Ga_{0.9}N/In_{0.05}Ga_{0.95}N$ for facilitating current diffusion in the foundation layer 12.

The active layer 20 illustratively has a multiple quantum well structure made of $In_{0.2}Ga_{0.8}N/In_{0.05}Ga_{0.95}N$. The second layer 21 includes a cladding layer 22 made of p-type $Al_{0.2}Ga_{0.8}N$ and a contact layer 24 made of p-type GaN.

In the crystal growth of such nitride semiconductors, use of MOCVD (metal organic chemical vapor deposition) or MBE (molecular beam epitaxy) can increase production scale while maintaining good crystallinity.

The term "nitride semiconductor" used herein refers to semiconductors represented by $(Al_xB_{1-x})_yGa_zIn_{1-y-z}N$ ($0 \leq x \leq 1$, $0 < y < 1$, $0 < z < 1$, $y+z \leq 1$), and further includes those containing any group V element such as As and P, and those containing a p-type or an n-type impurity.

An n-side electrode 16 is selectively formed on the foundation layer 12, and a p-side electrode 26 is selectively formed on the contact layer 24. Light from the active layer 20 is emitted upward, laterally, and downward. If a reflecting layer is formed below the sapphire substrate 10, the light directed downward can be reflected and extracted upward or laterally, which facilitates increasing light extraction efficiency.

In the energy band diagram of FIG. 1A, the horizontal axis X represents the relative position along the perpendicular direction of FIG. 1B, with the direction from the first layer 11 to the second layer 21 assumed positive. Electrons in the conduction band 40 constitute an electron current 46 toward the second layer 21 and are injected into the active layer 20. Holes in the valence band 42 constitute a hole current 48 toward the first layer 11 and are injected into the active layer 20. Here, the quasi-Fermi level is labeled with reference numeral 44. In this figure, the number of wells is eight.

Figure 2A:
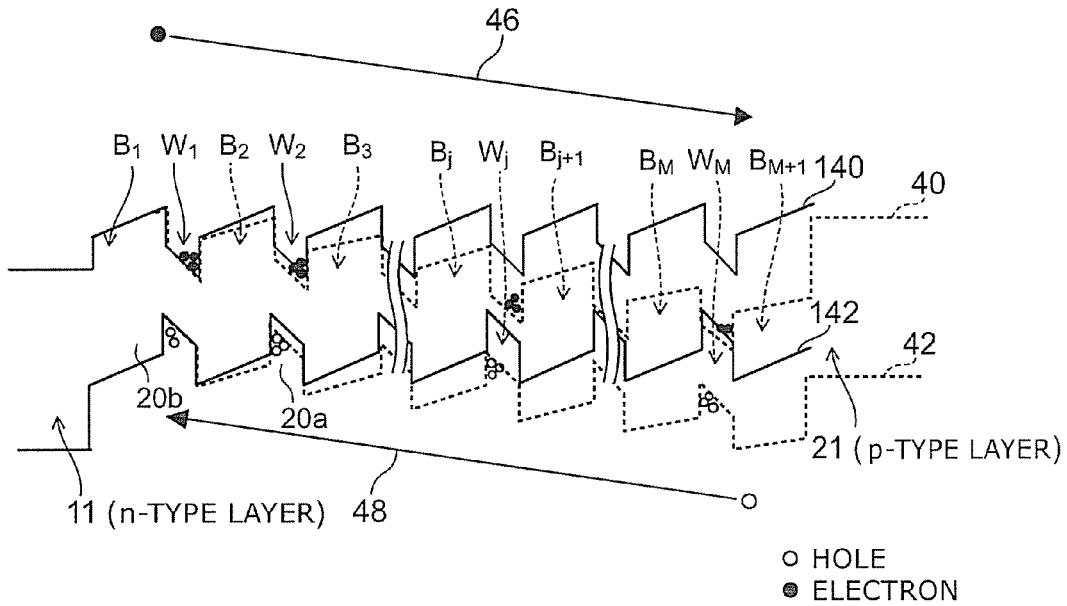
FIGS. 2A and 2B illustrate energy band bending.
Figure 2B:
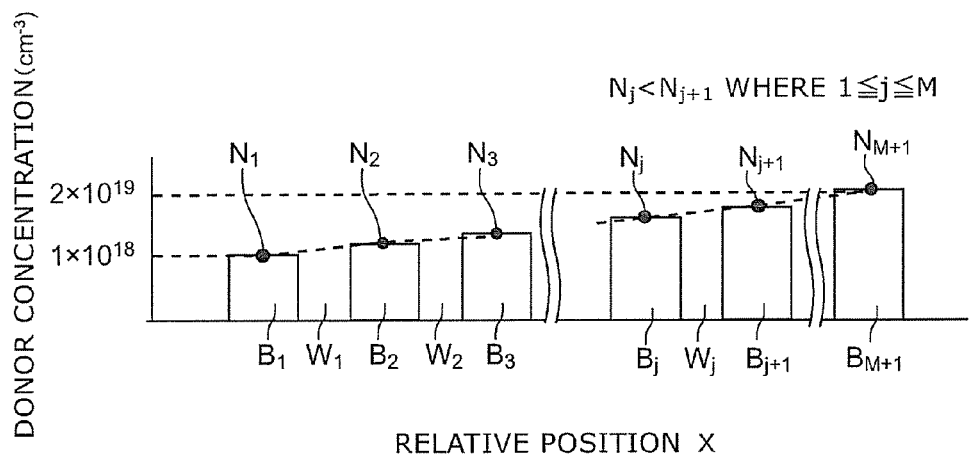

FIG. 2 illustrates energy band bending. More specifically, FIG. 2A is an energy band diagram in the vicinity of the active layer of FIG. 1A, and FIG. 2B shows impurity concentration in the barrier layer.

A nitride semiconductor is a material with large piezoelectric effect. Lattice mismatch causes a compressive strain in the plane of the well layer 20a and produces an internal electric field along the X axis in the active layer 20. This internal electric field tilts the energy band of the well layer 20a and the barrier layer 20b.

A width of the well layer 20a can be illustratively in the range from 2 to 8 nm. A width of the barrier layer 20b can be illustratively in the range from 5 to 25 nm, and more preferably in the range from 5 to 15 nm. If the width of the barrier layer 20b is narrower, it is difficult to confine carriers. If the width of the barrier layer 20b is thicker, the quantum effect is suppressed, and migration of carriers is made difficult.

In this embodiment, impurity concentration in the barrier layer 20b is gradually varied.

More specifically, the impurity concentration of the first conductivity type in each barrier layer 20b of the multiple quantum well has a generally flat distribution or increases toward the second layer 21. The average of the impurity concentration in the barrier layer 20b on the second layer 21 side as viewed from each well layer 20a of the multiple quantum well is equal to or greater than the average of the impurity concentration in the barrier layer 20b on the first layer side. Furthermore, the average of the impurity concentration in the barrier layer 20b nearest to the second layer 21 is higher than the average of the impurity concentration in the barrier layer 20b nearest to the first layer 11.

In the example shown in FIG. 2, the barrier layers 20b are of n-type, and the donor concentration therein is gradually increased toward the first layer 11 (p-type layer). More specifically, the donor concentration is determined so that the following formula holds between the average donor concentration $N_j$ in the j-th barrier layer $B_j$ and the average donor concentration $N_{j+1}$ in the (j+1)-th barrier layer $B_{j+1}$:

$$N_j < N_{j+1}$$

where $1 \leq j \leq M$ (M being the number of wells).

In FIG. 2B, the donor concentration is constant (i.e., equal to the average) in each barrier layer 20b.

For example, in the case where the first layer 11 has a donor concentration of $1 \times 10^{18}$ cm$^{-3}$ and the second layer 21 has an acceptor concentration of $2 \times 10^{19}$ cm$^{-3}$, the average donor concentration $N_j$ in the barrier layer $B_j$ is gradually increased toward the second layer 21 relative to the donor concentration in the first layer 11. Then, in the active layer 20 made of a multiple quantum well, the entire energy band of the conduction band 40 and the valence band 42 indicated by the dotted lines can be gradually bent, which facilitates distributing injected carriers into the respective well layers $W_j$ and efficiently confining them.

In particular, this band bending allows holes, which have a large mass and are difficult to transfer, to migrate more easily toward the first layer 11 (n-type). This facilitates efficiently confining them in the respective well layers $W_j$, and hence enhancing recombination efficiency in the multiple quantum well structure.

By way of comparison, the solid lines indicate a conduction band 140 and a valence band 142 in the case where the average donor concentration $N_j$ in the barrier layer $B_j$ is generally the same independent of its position.

In FIG. 2A, the slope of the (j+1)-th barrier layer $B_{j+1}$ is more gradual than the slope of the j-th barrier layer $B_j$. That is, the barrier becomes lower as it comes close to the second layer 21, which further facilitates migration of carriers.

While the first layer 11 and each barrier layer $B_j$ are of n-type and the second layer 21 is of p-type in FIG. 2, the conductivity type may be reversed. That is, the first layer may be of p-type, the second layer may be of n-type, the barrier layer 20b may be of p-type, and the acceptor concentration in the barrier layer $B_j$ may be gradually increased toward the second layer 21.

Figure 3A:
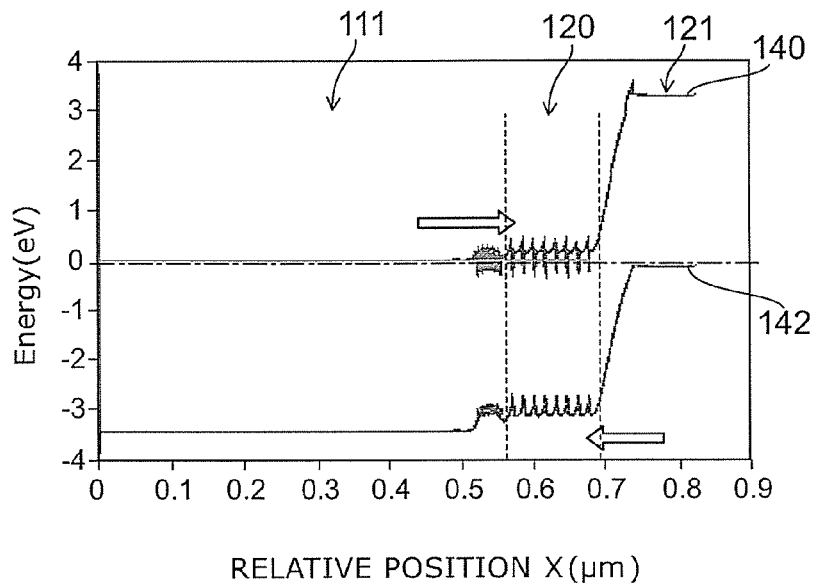
FIGS. 3A to 3C illustrate the band of a nitride semiconductor light emitting device according to a comparative example.
Figure 3B:
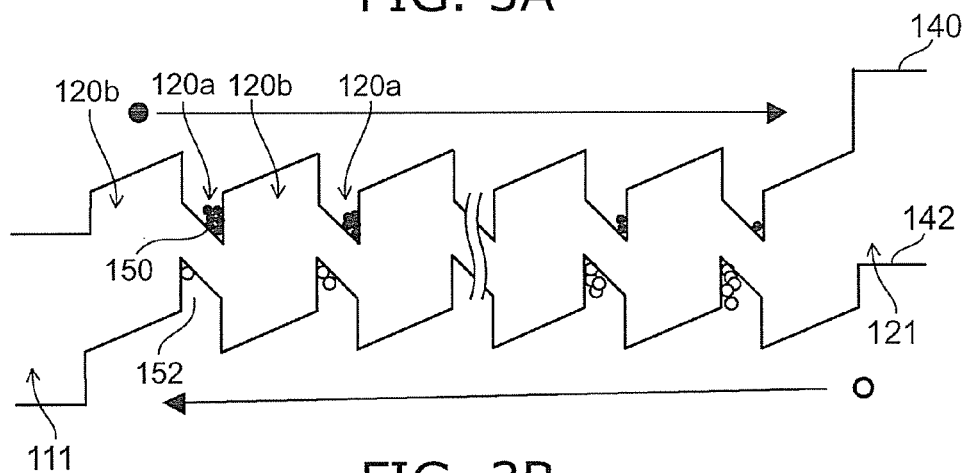
Figure 3C:
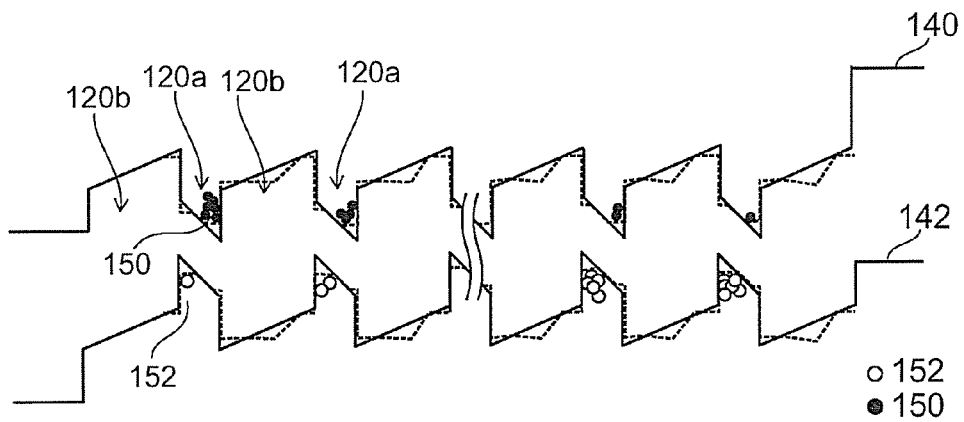

FIG. 3 illustrates the band of a nitride semiconductor light emitting device according to a comparative example. More specifically, FIG. 3A is a band diagram of the entire chip, and FIGS. 3B and 3C are band diagrams of the active layer.

In FIG. 3B, in a light emitting element (LED) with a large number of wells, the barrier layers 120b are doped with an n-type impurity (Si). The donor concentration is constant at generally $3 \times 10^{18}$ cm$^{-3}$ in each barrier layer 120b, and generally the same independent of the position of the barrier layers 120b in the multiple quantum well 120.

In this case, because the well layer 120a and the barrier layer 120b are tilted, electrons 150 and holes 152 are likely to be spatially separated in each well layer 120a, and carrier transfer between the well layers 120a is difficult. In the active layer 120 as a whole, the conduction band 140 and the valence band 142 have no band bending. More electrons 150 are accumulated in the well layer 120a on the first layer 111 side, whereas more holes 152 are accumulated in the well layer 120a on the second layer 121 side. Thus, carriers are likely to be separated to the well layers 120a at both ends of the active layer 120.

Therefore, carriers are distributed nonuniformly in the active layer 120, decreasing recombination efficiency. In particular, in the case where the amount of injected carriers is small, the recombination efficiency greatly decreases, which results in significant decrease in emission efficiency. That is, in the comparative example of FIG. 3B, improvement in recombination efficiency is limited.

If the donor concentration in the center portion of the barrier layer 120b is made higher the donor concentration in the portion in contact with the well layer 120a, as indicated by the dotted lines in FIG. 3C, the barrier at the center of the barrier layer 120b is decreased toward the second layer 121, and the slope of the band at the interface between the barrier layer 120b and the well layer 120a is decreased. However, this does not result in a band bending large enough to facilitate migration of carriers.

In contrast, in this embodiment shown in FIG. 2A, band bending occurs throughout the multiple quantum well layers. Hence, carriers easily migrate in the active layer 20, and electrons 50 and holes 52 can be efficiently confined in the M well layers $W_j$. Thus, recombination is further enhanced in each well layer $W_j$, which facilitates improving emission efficiency while preventing carrier overflow.

Figure 4:
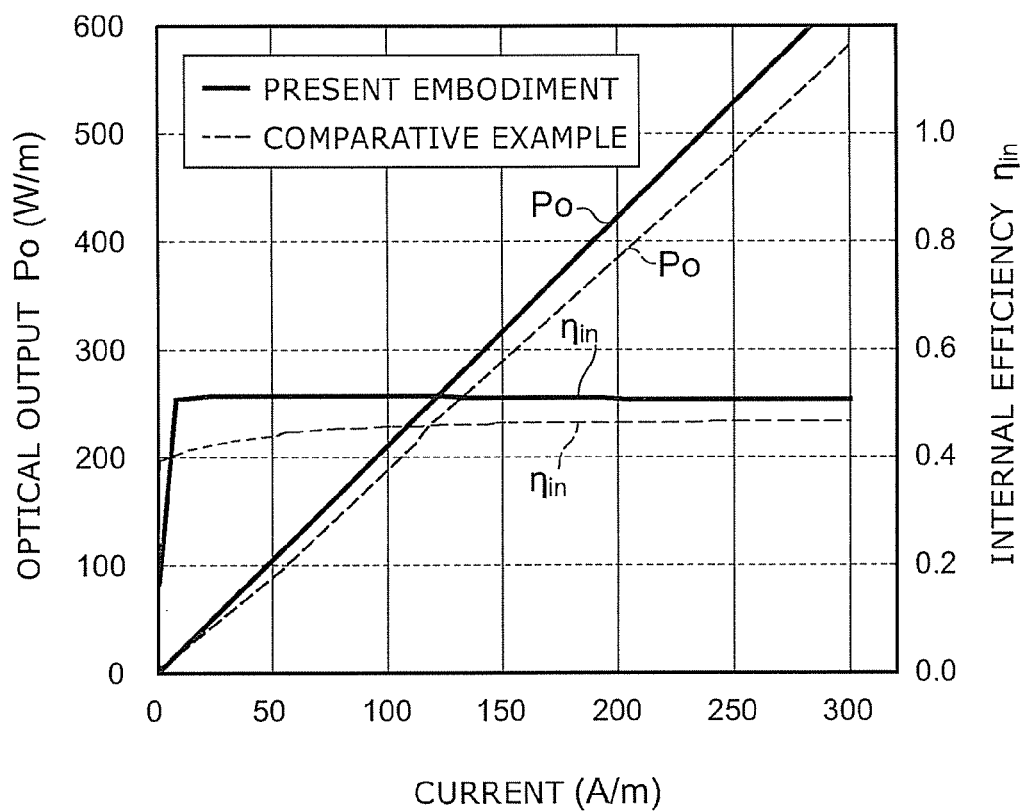
FIG. 4 is a graph showing characteristics for optical output and internal (emission) efficiency.

FIG. 4 is a graph showing a simulation result for optical output and internal (emission) efficiency. The vertical axis represents optical output Po (W/m) and internal efficiency $\eta_{in}$, and the horizontal axis represents current (A/m). Here, "m" refers to meter, representing the unit length in the depth direction of the cross section of FIG. 1B. The solid lines indicate this embodiment, and the dashed lines indicate the comparative example.

For example, at a current of 250 A/m, the optical output Po of this embodiment is generally 530 W/m, which is as high as approximately 1.12 times the optical output Po of the comparative example, generally 475 W/m. At the same current 250 A/m, the internal efficiency $\eta_{in}$ of this embodiment is generally 51%, which is as high as approximately 1.11 times the internal efficiency $\eta_{fin}$ of the comparative example, generally 46%. Furthermore, at a low current of 50 A/m, the optical output Po of this embodiment is generally 110 W/m, which is as high as 1.29 times the optical output Po of the comparative example, generally 85 W/m. At the same current 50 A/m, the internal efficiency $\eta_{in}$ of this embodiment is generally 52%, which is as high as approximately 1.21 times the internal efficiency $\eta_{in}$ of the comparative example, generally 43%. Thus, this embodiment readily maintains high optical output Po and internal efficiency $\eta_{in}$ in a wide current range.

The number of wells and the impurity concentration distribution in the active layer 20 are to be in a suitable range. For a nitride semiconductor, because of its large stress/strain, it is typically preferable that the number of wells is 15 or less, and for a light emitting element (LED), it is more preferably in the range from 6 to 12. In the case where the band is bent by varying donor concentration in the barrier layer $B_j$, an excessively large band bending results in increasing the number of carriers that can be confined in the well layer 20a, and increasing the carriers passing through the active layer 20. This decreases carriers contributing to recombination, and may fail to sufficiently improve emission efficiency. Improvement in emission efficiency is facilitated when the number of well layers $W_j$ is 6 to 12 and the average donor concentration is in the range from $1 \times 10^{18}$ to $2 \times 10^{19}$ cm$^{-3}$.

Figure 5A:
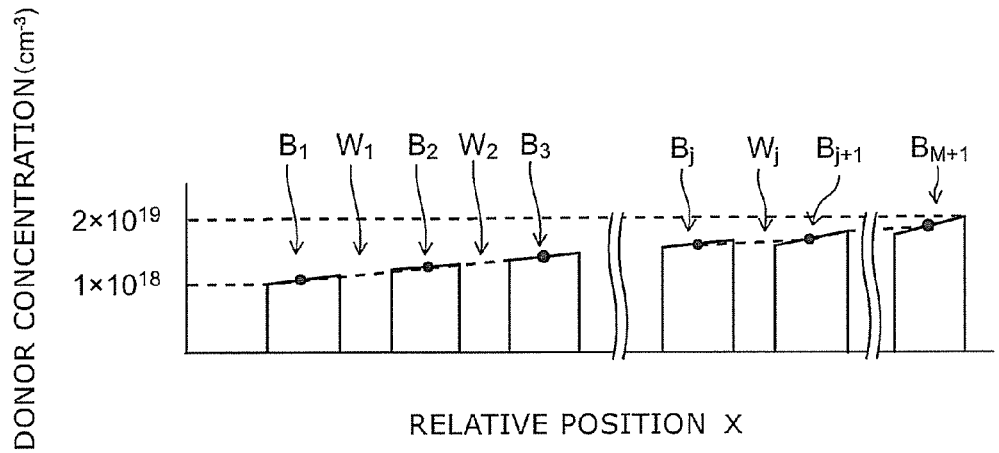
FIGS. 5A and 5B show a variation of the donor concentration distribution in the barrier layer.
Figure 5B:
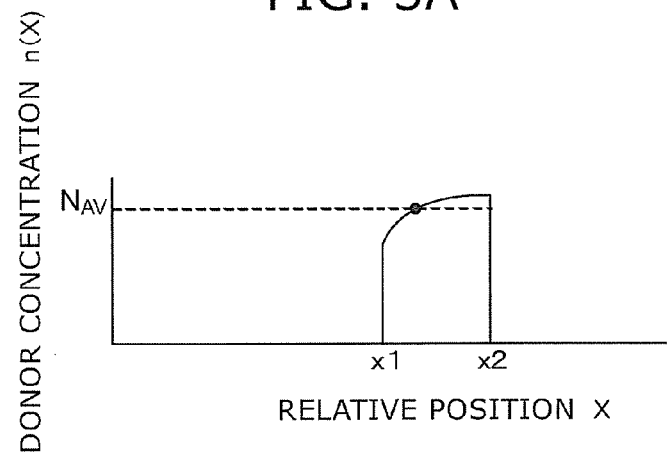

FIG. 5 shows a variation of the donor concentration distribution in the barrier layer. More specifically, FIG. 5A shows the increase of the impurity concentration distribution, and FIG. 5B illustrates the average of the impurity concentration distribution.

In the case where the impurity concentration is not flat, the average impurity concentration Nav determined by integrating impurity concentration n(x) in each barrier layer 20b is given by formula (1):

$$N_{AV} = \frac{\int_{x1}^{x2} n(x)dx}{x2 - x1} \tag{1}$$

where $N_{AV}$ is average impurity concentration, n(x) is impurity concentration, and x1 and x2 are end positions of the barrier layer.

In FIG. 2B, the donor concentration in the barrier layer 20b is flat at a constant value. However, the invention is not limited thereto. The donor concentration may increase toward the second layer 21 in each barrier layer $B_j$ ($1 \leq j \leq M$). In FIG. 5A, the donor concentration $N_j$ linearly increases in the barrier layer $B_j$, but may increase in a curved manner.

Also in this case, the j-th average $Nav_j$ and the (j+1)-th average $Nav_{j+1}$ of the impurity concentration are determined so as to satisfy formula (2):

$$Nav_j < Nav_{j+1} \tag{2}$$

where $1 \leq j \leq M$.

Thus, if the impurity concentration is gradually increased in each barrier layer $B_j$, the band bending throughout the active layer 20 is readily controlled, which facilitates carrier transfer.

Figure 6:
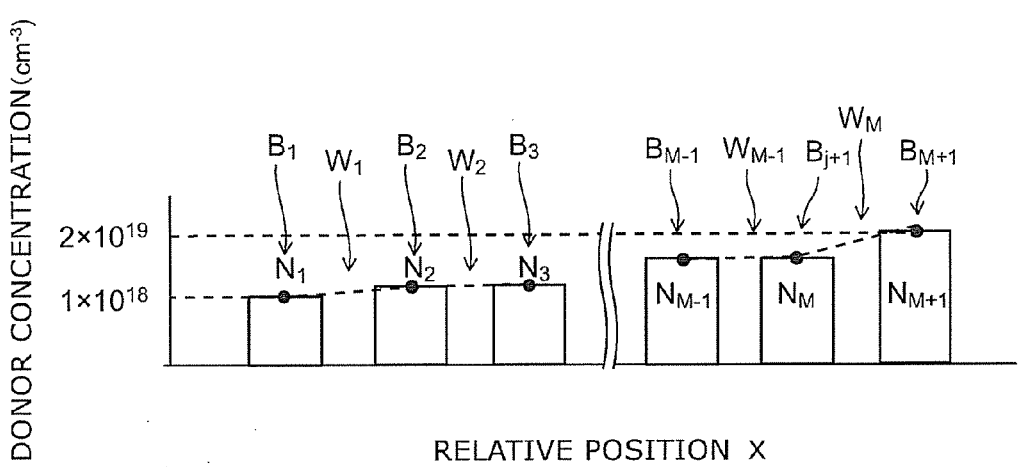
FIG. 6 shows a variation of the impurity concentration distribution in the barrier layer.

FIG. 6 shows a variation of the impurity concentration distribution in the barrier layer.

The impurity concentration distribution in each barrier layer $B_j$ is assumed to be flat. If it is not flat, it may be replaced by the average impurity concentration $N_{AV}$ given by formula (1).

The requirement is that the average $Nav_{M+1}$ for the barrier layer $B_{M+1}$ nearest to the second layer 21 is higher than the average $Nav_1$ for the barrier layer $B_1$ nearest to the first layer 11. That is, band bending occurs and can facilitate carrier transfer as long as there is at least one region satisfying $Nav_j < Nav_{j+1}$.

In FIG. 6, for example, the average $Nav_2$ for the barrier layer $B_2$ is equal to the average $Nav_3$ for the barrier layer $B_3$, and the average $Nav_{M-1}$ for the barrier layer $B_{M-1}$ is equal to the average $Nav_M$ for the barrier layer $B_M$. Also in this case, the average $Nav_{M+1}$ for the barrier layer $B_{M+1}$ nearest to the second layer 21 can be made higher than the average $Nav_1$ for the barrier layer $B_1$ nearest to the first layer 11. Hence, band bending occurs and can facilitate carrier transfer. The crystal growth process is simpler for the impurity concentration distribution shown in FIG. 6 than for the impurity concentration distribution shown in FIG. 2B.

For a multiple quantum well with the width of the well layer 20a being in the range from 2 to 8 nm and the width of the barrier layer 20b being 5 to 15 nm, for example, the multiple quantum well structure made of $In_{0.2}Ga_{0.8}N$ (well layer)/$In_{0.05}Ga_{0.95}N$ (barrier layer) can be sequentially crystal-grown illustratively by MOCVD. In the case where the barrier layer 20b is of n-type, Si produced by decomposing $SiH_4$ (silane) gas, for example, can be used as a donor.

For example, by using an MOCVD apparatus to automatically control the flow rate, reaction time, reaction temperature and the like of SiH$_4$ gas serving as a doping gas, gradual increase of donor concentration as shown in FIGS. 2B, 5A, and 6 can be readily achieved. In this embodiment, the average impurity concentration Nay in the barrier layer B$_j$ is gradually increased or decreased. Hence, the time required for crystal growth of the multiple quantum well can be made generally the same as in the case where the concentration is constant in the barrier layer B$_j$. Thus, the productivity of the crystal growth process is readily enhanced, and this embodiment can provide a light emitting device with high manufacturability.

While the above embodiment provides a light emitting device based on nitride semiconductors, the invention is not limited thereto. It is also possible to provide a light emitting device made of InAlGaP-based materials with small piezoelectric effect, which can emit light in the visible wavelength range. For InAlGaP-based materials with small stress/strain, the number of wells is illustratively 40. Also in this case, if the concentration in the barrier layer is gradually varied to bend the band, recombination in the multiple quantum well is enhanced while preventing carrier overflow, and emission efficiency can be improved. Here, the InAlGaP-based material refers to a material represented by composition formula In$_x$(Ga$_y$Al$_{1-y}$)$_{1-x}$P (where $5 \leq x \leq 1$, $0 \leq y \leq 1$), and also includes those doped with a p-type or an n-type impurity.

The invention is not limited to LED, but is also applicable to semiconductor laser devices, in which the impurity concentration in the barrier layer is gradually varied to bend the band so that carrier recombination is enhanced and emission efficiency is improved.

The embodiment of the invention has been described with reference to the drawings. However, the invention is not limited to the above embodiment. For example, those skilled in the art can variously modify the material, size, shape, layout and the like of the active layer, multiple quantum well, well layer, barrier layer, cladding layer, contact layer, current diffusion layer, foundation layer, and substrate constituting the light emitting device, and such modifications are also encompassed within the scope of the invention unless they depart from the spirit of the invention.

What is claimed is:

1. A light emitting device comprising:
a first layer made of a semiconductor of a first conductivity type;
a second layer made of a semiconductor of a second conductivity type;
an active layer including a multiple quantum well provided between the first layer and the second layer, impurity concentration of the first conductivity type in each barrier layer of the multiple quantum well having a generally flat distribution, the impurity concentration in the barrier layer on the second layer side as viewed from each well layer of the multiple quantum well being equal to or greater than the impurity concentration in the barrier layer on the first layer side, and the impurity concentration in the barrier layer nearest to the second layer being higher than the impurity concentration in the barrier layer nearest to the first layer,
the impurity concentration in the each barrier layer being equal to or greater than the impurity concentration in the first layer.

2. The device according to claim 1, wherein
the active layer includes the well layer made of In$_x$Ga$_{1-x}$N (where $0.05 \leq x \leq 1$) and the barrier layer made of In$_y$Ga$_{1-y}$N (where $0 \leq y \leq 1$ and x>y),
the first layer is made of Al$_t$Ga$_{1-t}$N (where $0 \leq t \leq 1.0$), and the second layer is made of Al$_u$Ga$_{1-u}$N (where $0 \leq u \leq 1.0$).

3. The device according to claim 1, wherein the first conductivity type is n-type.

4. The device according to claim 3, wherein an impurity concentration of the each barrier layer is equal to or greater than $1 \times 10^{18}$ cm$^{-3}$ and equal to or less than $2 \times 10^{19}$ cm$^{-3}$.

5. The device according to claim 1, wherein a width of the barrier layer is equal to or greater than 5 nm and equal to or less than 25 nm.

6. The device according to claim 1, wherein a width of the well layer is equal to or more than 2 nm and equal to or less than 8 nm.

7. The device according to claim 1, wherein a number of the well layer is equal to or less than 15.

8. A light emitting device comprising:
a first layer made of a semiconductor of a first conductivity type;
a second layer made of a semiconductor of a second conductivity type;
an active layer including a multiple quantum well provided between the first layer and the second layer, impurity concentration of the first conductivity type in each barrier layer of the multiple quantum well having a generally flat distribution, the impurity concentration in the barrier layer on the second layer side as viewed from each well layer of the multiple quantum well being greater than the impurity concentration in the barrier layer on the first layer side,
the impurity concentration in the each barrier layer being equal to or greater than the impurity concentration in the first layer.

9. The device according to claim 8, wherein
the active layer includes the well layer made of In$_x$Ga$_{1-x}$N (where $0.055 \leq x \leq 1$) and the barrier layer made of In$_y$Ga$_{1-y}$N (where $0 \leq y \leq 1$ and x>y),
the first layer is made of Al$_t$Ga$_{1-t}$N (where $0 \leq t \leq 1.0$), and the second layer is made of Al$_u$Ga$_{1-u}$N (where $0 \leq u \leq 1.0$).

10. The device according to claim 8, wherein the first conductivity type is n-type.

11. The device according to claim 10, wherein an impurity concentration of the each barrier layer is equal to or greater than $1 \times 10^{18}$ cm$^{-3}$ and equal to or less than $2 \times 10^{19}$ cm$^{-3}$.

* * * * *